(12) United States Patent
Kawaguchi et al.

(10) Patent No.: US 10,833,649 B2
(45) Date of Patent: Nov. 10, 2020

(54) ACOUSTIC WAVE ELEMENT AND COMMUNICATION APPARATUS

(71) Applicant: KYOCERA Corporation, Kyoto (JP)

(72) Inventors: Masaya Kawaguchi, Kirishima (JP); Tetsuya Kishino, Nara (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/096,200

(22) PCT Filed: Apr. 26, 2017

(86) PCT No.: PCT/JP2017/016610
§ 371 (c)(1),
(2) Date: Oct. 24, 2018

(87) PCT Pub. No.: WO2017/188342
PCT Pub. Date: Nov. 2, 2017

(65) Prior Publication Data
US 2019/0140613 A1  May 9, 2019

(30) Foreign Application Priority Data

Apr. 27, 2016 (JP) ................. 2016-088903

(51) Int. Cl.
*H03H 9/02* (2006.01)
*H03H 9/64* (2006.01)
(Continued)

(52) U.S. Cl.
CPC .... *H03H 9/02866* (2013.01); *H03H 9/02992* (2013.01); *H03H 9/145* (2013.01);
(Continued)

(58) Field of Classification Search
CPC .......... H03H 9/02866; H03H 9/14538; H03H 9/725; H03H 9/6489; H03H 9/02992; H03H 9/25; H03H 9/145
(Continued)

(56) References Cited

U.S. PATENT DOCUMENTS 7,576,471 B1  8/2009 Solal
9,257,960 B2 * 2/2016 Ruile ................ H03H 3/08
(Continued)

FOREIGN PATENT DOCUMENTS

JP  2013-518455 A  5/2013
WO 2006/109591 A1  10/2006
(Continued)

*Primary Examiner* — Robert J Pascal
*Assistant Examiner* — Jorge L Salazar, Jr.
(74) *Attorney, Agent, or Firm* — Procopio Cory Hargreaves and Savitch LLP

(57) ABSTRACT

In an IDT electrode of an acoustic wave element which includes first electrode fingers and second electrode fingers connected to potentials which are different from each other and arranged spaced apart from each other, the first electrode fingers includes first tip parts, and either of the first electrode fingers and the second electrode fingers includes, at a tip area extending along a direction of propagation of an acoustic wave and overlapping with the first tip parts, increase sections in which electrode volumes per unit lengths in a direction of extension of the first electrode fingers and the second electrode fingers are larger in comparison with that of the center area in which the electrode fingers intersect.

12 Claims, 13 Drawing Sheets

(51) Int. Cl.
  *H03H 9/145* (2006.01)
  *H03H 9/25* (2006.01)
  *H03H 9/72* (2006.01)

(52) U.S. Cl.
  CPC .......... *H03H 9/14538* (2013.01); *H03H 9/25* (2013.01); *H03H 9/6489* (2013.01); *H03H 9/725* (2013.01)

(58) Field of Classification Search
  USPC .......................... 333/133, 193–196; 310/364
  See application file for complete search history.

(56) References Cited

U.S. PATENT DOCUMENTS

| | | |
|---|---|---|
| 2007/0296528 A1 | 12/2007 | Kando |
| 2012/0188026 A1* | 7/2012 | Yamaji ............... H03H 9/14535 333/133 |
| 2013/0051588 A1 | 2/2013 | Ruile et al. |
| 2016/0261038 A1 | 9/2016 | Tanaka |
| 2017/0047905 A1 | 2/2017 | Araki et al. |

FOREIGN PATENT DOCUMENTS

| | | |
|---|---|---|
| WO | 2015/064238 A1 | 5/2015 |
| WO | 2015/182522 A1 | 12/2015 |

\* cited by examiner

FIG.5
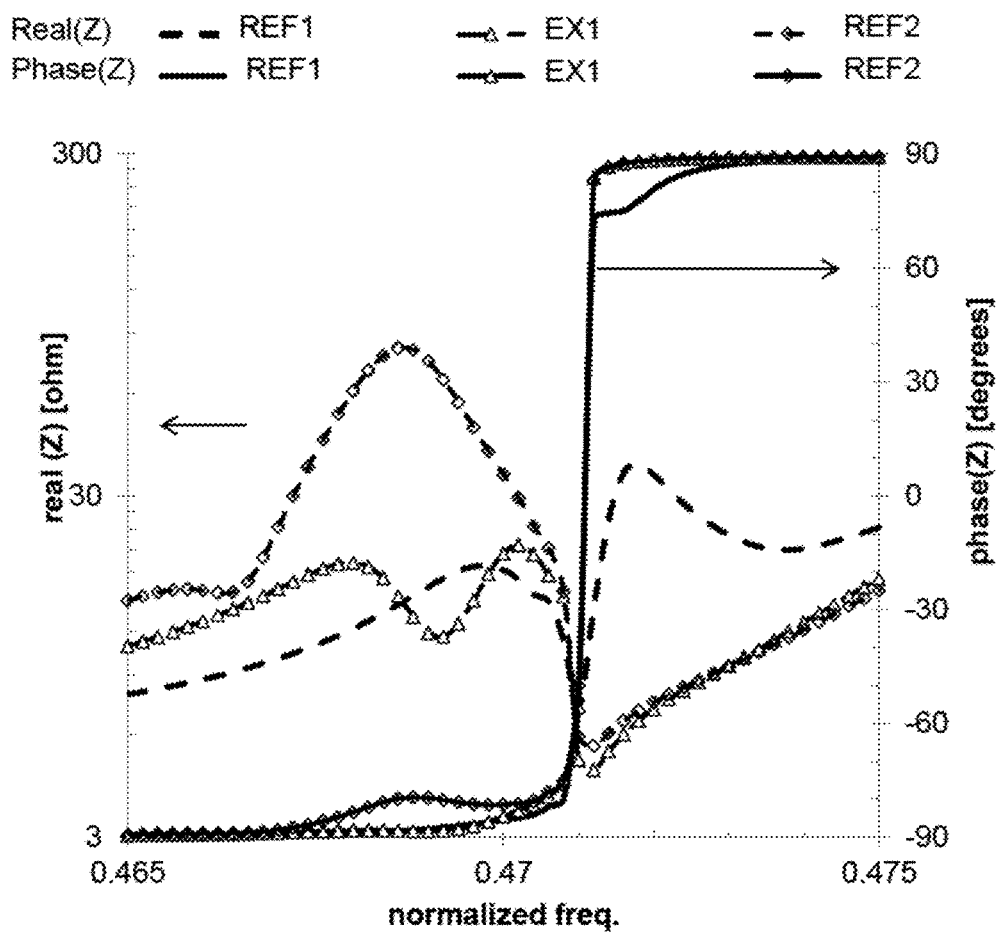
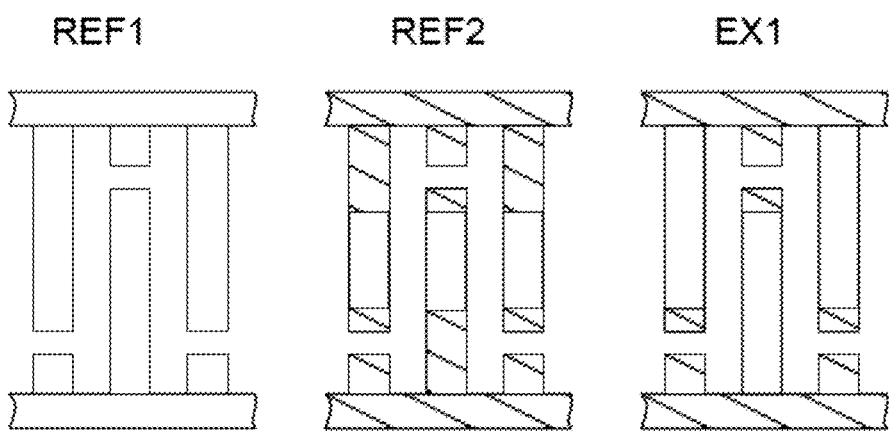

FIG.6
REF1
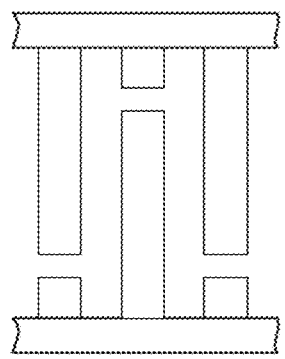
REF3
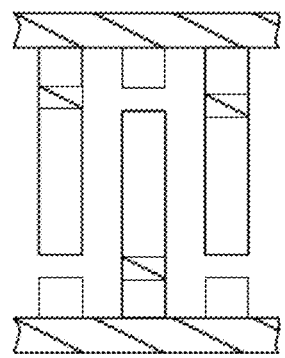
EX2
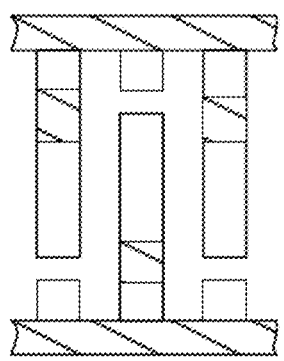
EX3
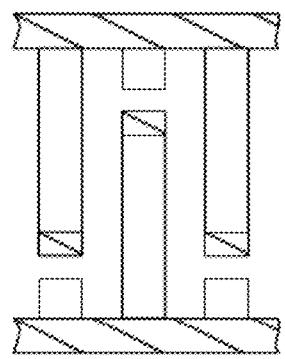

FIG.9
REF1
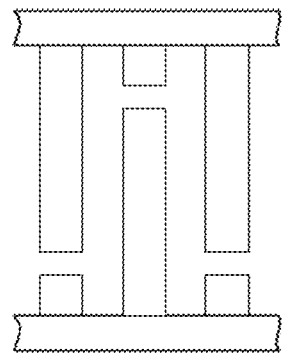
REF2
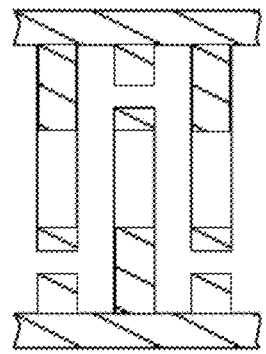
EX1
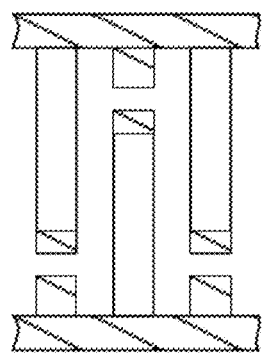
EX5
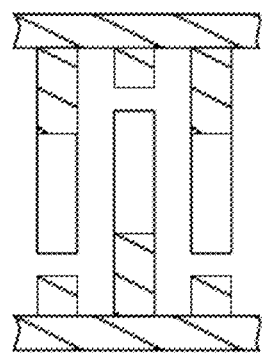
EX6
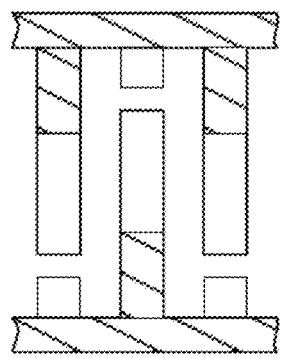

US 10,833,649 B2

ACOUSTIC WAVE ELEMENT AND COMMUNICATION APPARATUS

TECHNICAL FIELD

The present invention relates to an acoustic wave element using a surface acoustic wave (SAW) and to a communication apparatus.

BACKGROUND ART

As an acoustic wave element, there is known one comprised of a piezoelectric substrate and an IDT (interdigital transducer) provided on a major surface of the same. Such an acoustic wave element is for example utilized in a transmission filter, receiving filter, etc. in a multiplexer.

The IDT electrode is for example provided with a pair of bus bars which face each other, a plurality of electrode fingers which alternately extend from one bus bar to the other bus bar side, and dummy electrodes which extend from the other bus bar in the direction of extension of the electrode fingers.

International Publication No. 2006/109591 discloses an example of improving the resonance characteristics by increasing the widths of the electrode fingers in the vicinity of the gaps between the ends of the electrode fingers and the dummy electrodes.

SUMMARY OF INVENTION

Technical Problem

In acoustic wave elements using such IDT electrodes, further improvement of the resonance characteristics has been demanded. Specifically, among the resonance characteristics, it has been demanded to provide an acoustic wave element with little loss.

The present disclosure is made in consideration with such circumstances and has as its object to provide an acoustic wave element having little loss and a communication apparatus using the same.

Solution to Problem

An acoustic wave element of one aspect of the present disclosure includes a piezoelectric substrate and an IDT electrode on an upper surface of the piezoelectric substrate. Further, the IDT electrode includes a first bus bar and second bus bar, first electrode fingers and second electrode fingers, and first dummy electrodes and second dummy electrodes. The first bus bar and the second bus bar are connected to potentials which are different from each other and are arranged spaced apart from each other. The first electrode fingers are connected to the first bus bar and extend toward the second bus bar side. The second electrode fingers are connected to the second bus bar and extend to the first bus bar side. Further, the first electrode fingers and the second electrode fingers are arranged so as to be adjacent to each other along a direction of propagation of an acoustic wave. The first dummy electrodes are connected to the first bus bar and face the second electrode fingers across second gaps. The second dummy electrodes are connected to the second bus bar and face the first electrode fingers across first gaps. Further, three areas extending along the direction of propagation of the acoustic wave are assumed. The three areas are a center area including a portion in which the first electrode fingers and the second electrode fingers intersect and areas on the two sides of the center area including a first end area closer to the first bus bar side than the center area and a second end area closer to the second bus bar side than the center area. Here, the first electrode fingers include first tip parts in the second end area. Further, either of the first electrode fingers and the second electrode fingers includes, at a tip area extending along the direction of propagation of the acoustic wave and overlapping with the first tip parts, increase sections in which electrode volumes per unit lengths in a direction of extension of the first electrode fingers and the second electrode fingers are larger in comparison with that of the center area.

A communication apparatus according to an aspect of the present disclosure includes a first filter having a first passing band and a second filter having a second passing band which is different from the first passing band. The acoustic wave element explained above is used in an acoustic wave filter used in the first filter or the second filter.

Advantageous Effects of Invention

An acoustic wave element having the above configuration and a communication apparatus using the same make the vibration distribution at the vicinities of the ends of the electrode fingers different to thereby suppress bulk waves leaked from space between the ends of the electrode fingers and dummy electrodes and thereby reduce the loss.

BRIEF DESCRIPTION OF DRAWINGS

FIG. 5 A graph showing frequency characteristics in examples and comparative examples.

FIG. 6 Enlarged views of the principal parts in examples and comparative examples.

FIG. 9 Enlarged views of the principal parts in examples and comparative examples.

DESCRIPTION OF EMBODIMENTS

Figure 1:
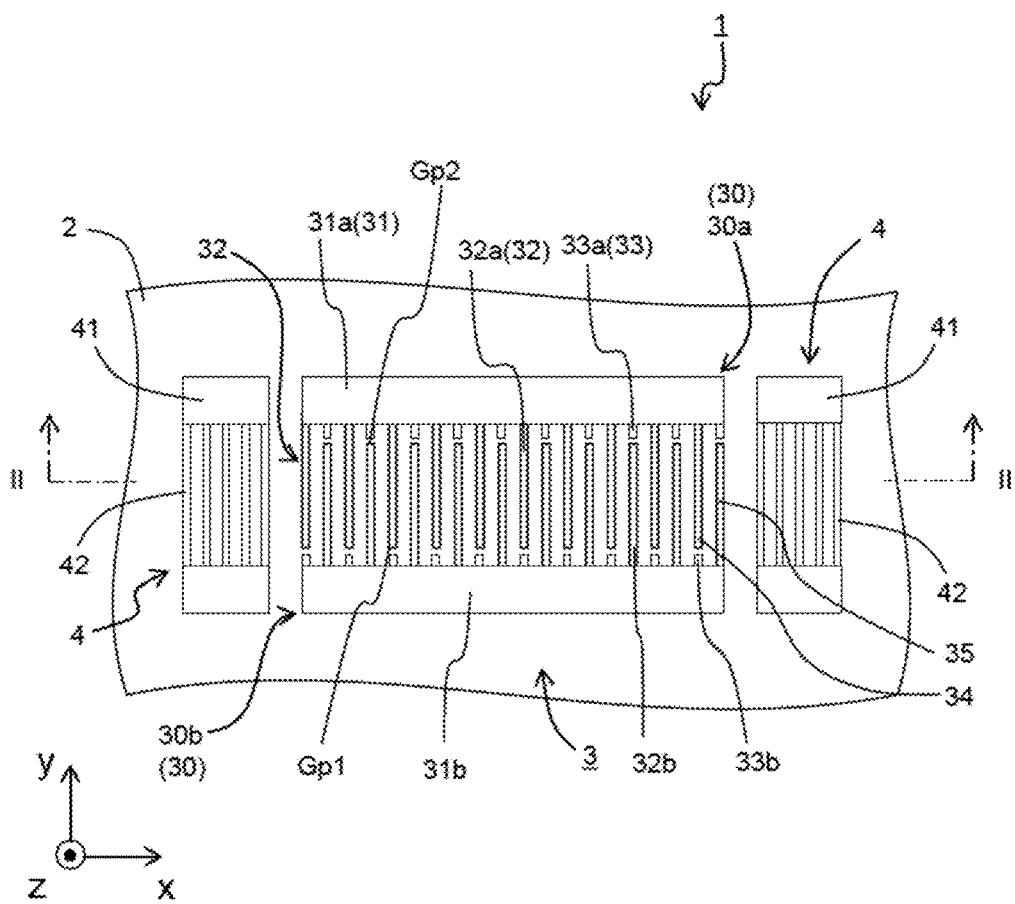
FIG. 1 A plan view of an acoustic wave element according to an embodiment of the present disclosure.

Below, an acoustic wave element (below, referred to as a "SAW element") according to an embodiment of the present disclosure will be explained with reference to the drawings. Note that, the drawings used in the following explanation are schematic ones, and dimension ratios etc. in the drawings do not always coincide with the real ones.

Further, in the modifications etc., for configurations which are common with or resemble the already explained embodiment, notations common with those in the already explained embodiments will be used, and sometimes illustrations and explanations will be omitted.

<Embodiment>

(Configuration of SAW Element)

(Fundamental Configuration)

Figure 2:
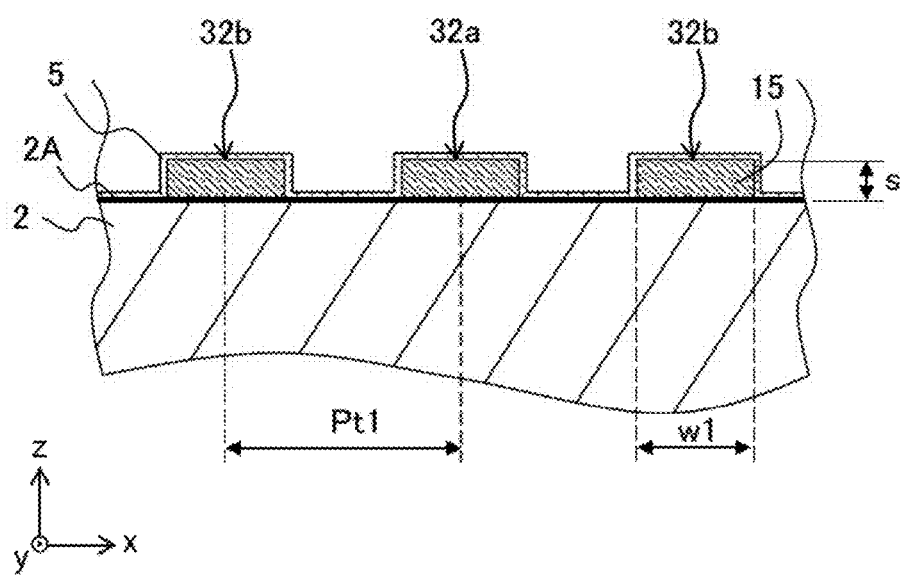
FIG. 2 A cross-sectional view of a principal part along the II-II line in FIG. 1.

FIG. 1 is a plan view showing the fundamental configuration of a SAW element 1 according to an embodiment of the present invention. FIG. 2 is a cross-sectional view of a principal part along the II-II line in FIG. 1. The SAW element 1 utilizes a SAW as an acoustic wave and has a piezoelectric substrate 2 and an excitation electrode 3 (below, described as the "IDT electrode 3") which is provided on an upper surface 2A of the piezoelectric substrate 2 as shown in FIG. 1. The IDT electrode 3 has two bus bars 31 which face each other, pluralities of electrode fingers 32 each of which extending from one bus bar 31 toward the other bus bar 31 side, and dummy electrode fingers 33 each of which faces an electrode finger 32. In each electrode finger 32, a portion facing the dummy electrode 33 will be defined as a "tip part 34".

Here, in the present embodiment, it is possible to provide a SAW element 1 with little loss by shaping the electrode fingers 32 and dummy electrodes 33 in the end areas A1 and A2 in the span from the tip part 34 of one electrode finger 32 up to the other bus bar 31 and the span from the tip part 34 of the other electrode finger 32 up to one bus bar 31 as in the configuration which will be explained later. Below, the configurations will be explained in detail.

The piezoelectric substrate 2 is comprised of a substrate of a single crystal made of lithium niobate (LN: $LiNbO_3$) crystal or lithium tantalate (LT: $LiTaO_3$) crystal or quartz crystal ($SiO_2$) and having a piezoelectric characteristic. The cut angle may be suitably determined. For example, it may be a 42°±10° Y-X cut or 0°±10° Y-X cut or the like in the case of LT. In the case of LN, it is a 128°±10° Y-X cut or 64°±10° Y-X cut or the like.

Note that, in the following explanation, an aspect where the piezoelectric substrate 2 is configured by a 38° to 48° Y-X cut substrate made of LT will be mainly taken as an example. Unless particularly noted otherwise, results of simulation etc. which will be explained later are obtained from 38° to 48° Y-X cut substrates made of LT.

The planar shape and various dimensions of the piezoelectric substrate 2 may be suitably set. As an example, the thickness (z-direction) of the piezoelectric substrate 2 is constant over the entire planar direction and can be illustrated as 0.2 mm to 0.5 mm.

The IDT electrode 3 is arranged on the upper surface 2A of the piezoelectric substrate 2. The IDT electrode 3, as shown in FIG. 1, has a first comb-shaped electrode 30a and a second comb-shaped electrode 30b. Note that, in the following explanation, sometimes the first comb-shaped electrode 30a and second comb-shaped electrode 30b will be simply referred to as the "comb-shaped electrodes 30" and will not be differentiated.

The comb-shaped electrodes 30, as shown in FIG. 1, have two bus bars 31 (first bus bar 31a and second bus bar 31b) which face each other and pluralities of electrode fingers 32 each of which extending from one bus bar 31 to the other bus bar 31 side. Further, the pair of comb-shaped electrodes 30 are arranged so that the first electrode fingers 32a and the second electrode fingers 32b intermesh (intersect) with each other in the direction of propagation of the SAW. The first electrode fingers 32a are electrically connected to the first bus bar 31a, while the second electrode fingers 32b are electrically connected to the second bus bar 31b.

Here, the first bus bar 31a and the second bus bar 31b are connected to different potentials.

Further, the comb-shaped electrodes 30 have dummy electrodes 33 facing respective electrode fingers 32. The first dummy electrodes 33a extend from the first bus bar 31a toward the second electrode fingers 32b. The second dummy electrodes 33b extend from the second bus bar 31b toward the first electrode fingers 32a. Here, a gap between a second dummy electrode 33b and a first electrode finger 32a is defined as a "first gap Gp1". In the same way, a gap between a first dummy electrode 33a and a second electrode finger 32b is defined as a "second gap Gp2".

The bus bars 31 are for example substantially formed in long shapes so as to linearly extend with constant widths. Accordingly, the edge parts of the bus bars 31 are shaped like straight line on the sides which face each other. The pluralities of electrode fingers 32 are for example substantially formed in long shapes so as to linearly extend with constant widths and are aligned at substantially constant intervals in the direction of propagation of the SAW.

Note that, the bus bars 31 also need not have constant widths. The edge parts of the bus bars 31 on the side which face each other (inner sides) only have to be shaped like straight line. For example, they may have trapezoidal shapes having the edge parts on inner sides as bottom sides as well.

Below, sometimes the first bus bar 31a and the second bus bar 31b will be simply referred to as the "bus bars 31" and will not be differentiated as to the "first" and the "second". In the same way, the first electrode fingers 32a and the second electrode fingers 32b will be simply referred to as the "electrode fingers 32", the first dummy electrodes 33a and the second dummy electrodes 33b will be simply referred to as the "dummy electrodes 33", and the first gap Gp1 and the second gap Gp2 will be simply referred to as the "gaps Gp" and will not be differentiated as to the "first" and the "second".

The pluralities of electrode fingers 32 of the pair of comb-shaped electrodes 30 configuring the IDT electrode 3 are aligned so that they are repeatedly arranged in the x-direction in the drawing. In more detail, as shown in FIG. 2, the first electrode fingers 32a and the second electrode fingers 32b are repeatedly arranged alternately at intervals on the upper surface 2A of the piezoelectric substrate 2.

In this way, the pluralities of electrode fingers 32 of the pair of comb-shaped electrodes 30 configuring the IDT electrode 3 are set so that their pitches become Pt1. A pitch Pt1 is the interval (repeated interval) between the centers of the two or more electrode fingers 32 and is for example provided so as to become equal to the half-wavelength of the wavelength λ of the SAW at the frequency at which resonation is desired to be caused. The wavelength λ (that is 2×Pt1) is for example 1.5 μm to 6 μm. In the IDT electrode 3, by arranging most of the pluralities of electrode fingers 32 so as to have the pitch Pt1, the pluralities of electrode fingers 32 are arranged at constant repeated intervals, therefore the SAW can be efficiently generated.

Here, as shown in FIG. 2, in the direction of propagation of the SAW, the pitch Pt1 designates the interval from the center of a first electrode finger 32a up to the center of a second electrode finger 32b which is adjacent to this first electrode finger 32a. In each electrode finger 32, the width w1 in the direction of propagation of the SAW is suitably set in accordance with the electrical characteristics etc. which are demanded from the SAW element 1. The width w1 of an electrode finger 32 is for example 0.3 times to 0.7 times the pitch Pt1.

FIG. 2 is a cross-sectional view of the center area Ac (see for example FIG. 3) in an intersecting area of the electrode fingers 32. The center area Ac designates an area in which the electrode fingers 32, excluding the tip parts 34 of the electrode fingers 32, intersect. It occupies most of the intersecting portion. For example, it may occupy 85% or more of the intersecting width in the direction perpendicular to the direction of propagation of the acoustic wave. Here, the electrode thickness of each electrode finger 32 in the center area Ac is defined as "s". Further, in each electrode finger 32, the portion positioned in the center area Ac is defined as the "center part 35".

A SAW which propagates in a direction perpendicular to these pluralities of electrode fingers 32 is generated. Accordingly, after considering the crystal orientation of the piezoelectric substrate 2, the two bus bars 31 are arranged so as to face each other and be spaced apart from each other in a direction intersecting the direction in which the SAW is desired to be propagated. The pluralities of electrode fingers 32 are formed so as to extend in the direction perpendicular with respect to the direction in which the SAW is desired to be propagated. Note that, the direction of propagation of the SAW is specified by the orientations of the pluralities of electrode fingers 32 and so on. In the present embodiment, however, for convenience, the orientations of the pluralities of electrode fingers 32 etc. will be sometimes explained using the direction of propagation of the SAW as the standard.

The lengths of the pluralities of electrode fingers 32 (the lengths from the bus bar 31 to the ends of the electrode fingers 32) are for example set to substantially the same. Note that, the length of each electrode finger 32 may be changed as well. For example, it may be made longer toward the direction of propagation or be made shorter. Specifically, by changing the length of each of the electrode fingers 32 with respect to the direction of propagation, an apodized IDT electrode 3 may be configured. In this case, spurious emission of the lateral mode can be reduced, and an electrical resistance can be improved.

The IDT electrode 3 is for example configured by a conductive layer 15 made of metal as shown in FIG. 2. As this metal, for example, there can be mentioned Al or an alloy containing Al as the principal ingredient (Al alloy). The Al alloy is for example an Al—Cu alloy. Note that, the IDT electrode 3 may be configured by a plurality of metal layers as well. The various dimensions of the IDT electrode 3 are suitably set in accordance with the electrical characteristics etc. demanded from the SAW element 1. The electrode thickness "s" (z-direction) in the center area Ac of the IDT electrode 3 is for example 50 nm to 600 nm.

The IDT electrode 3 may be directly arranged on the upper surface 2A of the piezoelectric substrate 2 or may be arranged on the upper surface 2A of the piezoelectric substrate 2 with another member interposed therebetween. The other member is made of for example Ti or Cr or an alloy of the same or the like. When the IDT electrode 3 is arranged on the upper surface 2A of the piezoelectric substrate 2 through another member, the thickness of the other member is set to a thickness that exerts almost no influence upon the electrical characteristics of the IDT electrode 3 (for example a thickness of about 5% of the thickness of the IDT electrode 3 in the case of Ti).

The IDT electrode 3, when a voltage is applied, excites the SAW propagating in the x-direction in the vicinity of the upper surface 2A of the piezoelectric substrate 2. The excited SAW is reflected at boundaries of the electrode fingers 32 with non-arrangement areas (areas each having a long shape and being between electrode fingers 32 which are adjacent to each other). Further, a standing wave in which a half-wavelength is the pitch Pt1 of the electrode fingers 32 is formed. The standing wave is converted to an electrical signal having the same frequency as this standing wave and is extracted by the electrode fingers 32. In this way, the SAW element 1 functions as a one-port resonator.

Reflectors 4 are arranged so as to sandwich the IDT electrode 3 in the direction of propagation of the SAW. Each reflector 4 is formed in a substantially lattice shape. That is, the reflector 4 has reflector bus bars 41 which face each other in the direction crossing the direction of propagation of the SAW and has a plurality of reflection electrode fingers 42 which extend in the direction perpendicular to the direction of propagation of the SAW between these bus bars 41. The reflector bus bars 41 are substantially formed in long shapes so as to linearly extend with constant widths and are arranged parallel in the direction of propagation of the SAW.

The plurality of reflection electrode fingers 42 are basically arranged at a pitch that reflects the SAW excited in the IDT electrode 3. The pitch of reflection electrode fingers 42 is the interval between the centers of two or more reflection electrode fingers 42 (repetition interval). When the pitch Pt1 of the IDT electrode 3 is set to a half-wavelength of the wavelength $\lambda$ of the SAW, the pitch of reflection electrode fingers 42 may be set to the same extent as the pitch Pt1.

Further, the plurality of reflection electrode fingers 42 are substantially formed in long shapes so as to linearly extend with constant widths. The widths of the reflection electrode fingers 42 can be set to for example substantially equal to the widths w1 of the electrode fingers 32. The reflectors 4 are for example formed by the same material as that for the IDT electrode 3 and are formed to thicknesses equal to the IDT electrode 3.

A protective layer 5, as shown in FIG. 2, is provided on the piezoelectric substrate 2 so as to cover the tops of the IDT electrode 3 and reflectors 4. Specifically, the protective layer 5 covers the surfaces of the IDT electrode 3 and reflectors 4 and covers the portions in the upper surface 2A of the piezoelectric substrate 2 which are exposed from the IDT electrode 3 and reflectors 4. The thickness of the protective layer 5 is for example 1 nm to 50 nm. As such a protective layer 5, use can be made of an SiOx film or SiNx film.

(Configurations of End Areas A1 and A2)

Here, the shapes of the electrode fingers 32 and dummy electrodes 33 in the IDT electrode 3 in the end areas A1 and A2 will be explained in detail.

Figure 3:
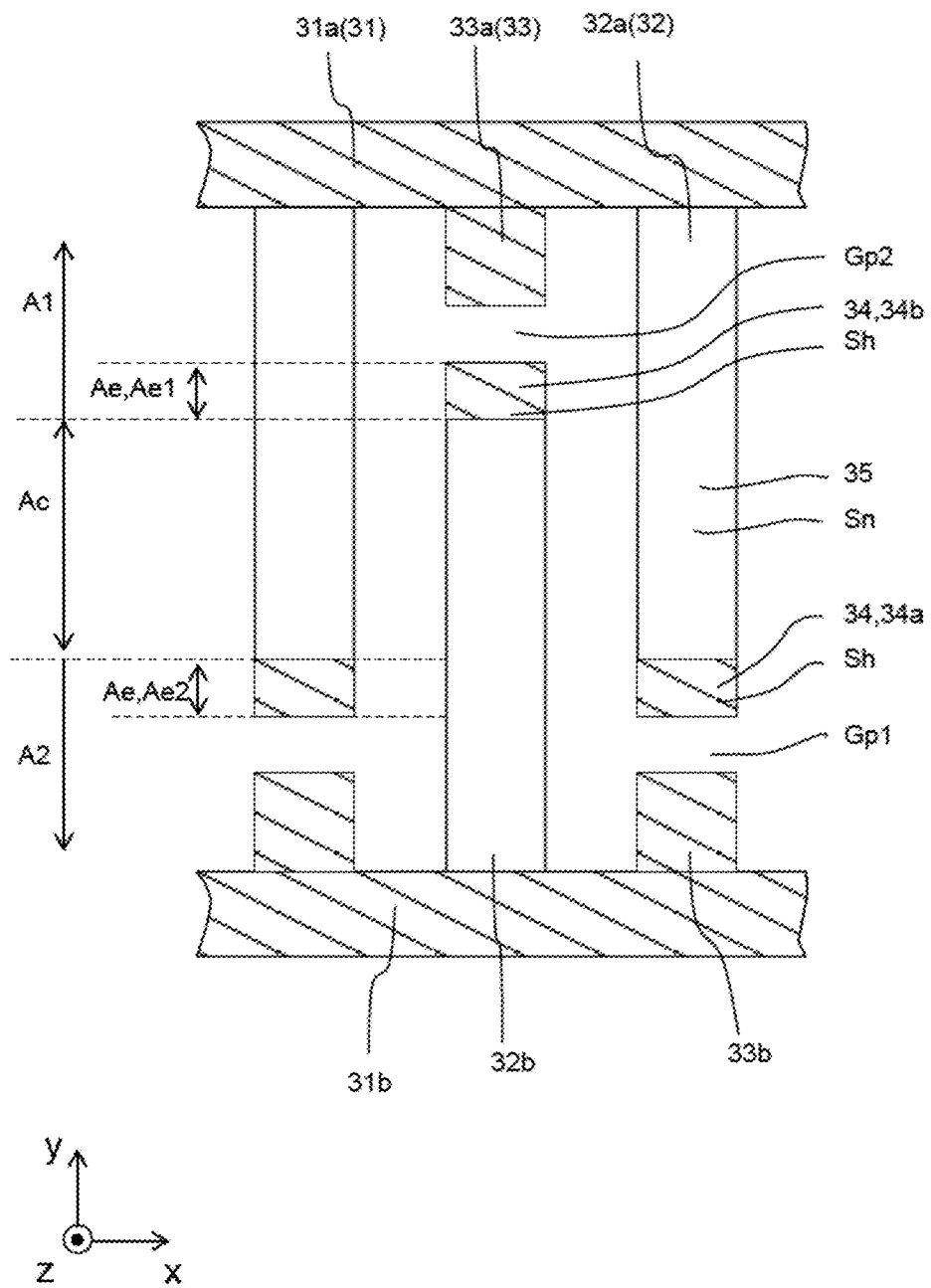
FIG. 3 An enlarged view of the principal part in an IDT electrode.
Figure 4:
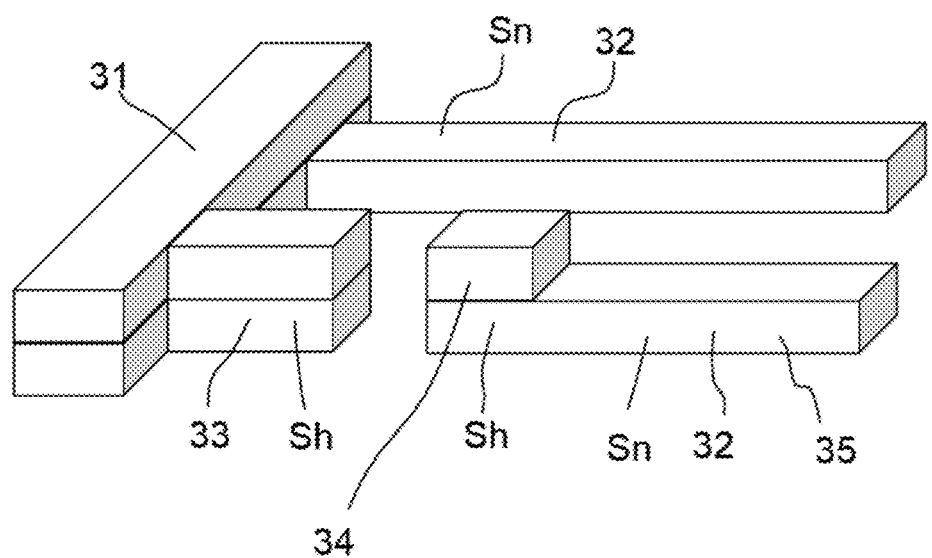
FIG. 4 A perspective view of the principal part in FIG. 3.

FIG. 3 is an enlarged plan view of a principal part in the IDT electrode 3. Further, FIG. 4 is an enlarged perspective view of the principal part. In FIG. 4, only one bus bar 31 is displayed, and drawing of the other bus bar 31 is omitted.

The IDT electrode 3 is provided with increase sections Sh in the end areas A1 and A2 which are different in volume per unit length in the direction of extension of the electrode fingers (y-direction) in comparison with the center area Ac. In this example, the increase sections Sh are realized by making the thicknesses greater. In FIG. 3, in order to make it easy to grasp the portions having different film thicknesses, hatching is attached to the portions having larger film thicknesses in comparison with the center part 35. As shown in FIG. 3, the thicknesses of portions of the IDT electrode 3 in the end areas A1 and A2 become larger than the thicknesses of the electrode fingers 32 in the center area Ac.

More specifically, in the end areas A1 and A2, in areas running along the direction of propagation of the SAW and overlapping with the tip parts 34 of the electrode fingers 32

(the first tip parts 34a positioned in the second end area A2 and the second tip parts 34b positioned in the first end area A1) and the gap Gp portions, parts having larger thicknesses, that is, increase sections Sh, and sections Sn having normal thicknesses are arranged alternately by the first electrode fingers 32a and the second electrode fingers 32b. In particular, in the end areas A1 and A2, in the areas running along the direction of propagation of the SAW and overlapping with the tip parts 34 of the electrode fingers 32 (below, referred to as the "tip areas Ae"), the increase sections Sh and the sections Sn having normal thicknesses are positioned alternately by the first electrode fingers 32a and the second electrode fingers 32b. This configuration will be referred to as the "Configuration 1". The tip areas Ae include a second tip area Ae2 positioned in the end area A1 and a first tip area Ae1 positioned in the end area A2. In this example, the dummy electrodes 33 and the tip parts 34 of the electrode fingers 32 and the bus bars 31 are made the increase sections Sh, and the remaining parts are made the sections Sn.

Further, in this example, in the end areas A1 and A2, in the areas extending along the direction of propagation of the SAW and overlapping with the gaps Gp and dummy electrodes 33, at least portions of either of the dummy electrodes 33 or electrode fingers 32 are provided with the increase sections Sh. This configuration will be defined as the "Configuration 2". In the SAW element 1, the dummy electrodes 33 are made the increase sections Sh, and the portions in the electrode fingers 32 which overlap with the dummy electrodes 33 along the direction of propagation of the SAW are made the sections Sn.

By employing such configurations, the SAW element 1 can suppress generation of loss.

Next, the effects according to the present configurations will be verified. FIG. 5 shows the results of simulation of the frequency characteristics in Example 1 and Comparative Examples 1 and 2 according to the FEM method (finite element method). Example 1 is modeled on the SAW element 1 provided with the IDT electrode 3 shown in FIGS. 3 and 4. Comparative Example 1 is modeled on a SAW element provided with an IDT electrode with uniform film thicknesses in the end areas A1 and A2 and center area Ac. That is, Comparative Example 1 is not provided with either the Configuration 1 or the Configuration 2.

Comparative Example 2 is modeled on a SAW element provided with an IDT electrode where all of the electrode fingers 32 and dummy electrodes 33 positioned in the end areas A1 and A2 become the increase sections Sh. That is, Comparative Example 2 is not provided with the Configuration 1 (but is provided with the Configuration 2).

In FIG. 5, views showing the configurations of the models are described together with the results of simulation.

The fundamental configuration of the SAW element used as the model of the comparative example is as in the following description.

Material of piezoelectric substrate: 42° Y-cut, and X-propagated LiTaO$_3$
Thickness of piezoelectric substrate: ∞ (usual LT substrate is supposed)
Material of electrode fingers: Al
Thickness of electrode fingers: 121 nm (thickness of section Sn)
Number of electrode fingers: Limitless number (periodic boundary condition)
Electrode finger pitch: 0.77 μm
Electrode finger width: 0.385 μm
Intersecting width: 30.8 μm
Gap length: 0.3 μm
Dummy electrode length: 3.08 μm Note that, in the fundamental configuration explained above, in comparison with a general SAW element, the gap length is made a little longer. Contrary to this, in Example 1, the configuration shown in FIG. 3 is employed, the thickness of the increase section Sh is made greater by 15% relative to the thickness of the section Sn, and the width occupied by the tip part 34 in an electrode finger 32 (the length in the y-direction) is made 3.25% (1 μm) for the simulation. Also, the thickness of the increase section Sh in Comparative Example 2 was made the same. The results of this simulation will be shown in FIG. 5.

Below, in the drawings, sometimes Comparative Example 1, Comparative Example 2, will be described as REF1, REF2, . . . , and Example 1, Example 2, will be described as EX1, EX2, . . . .

In FIG. 5, an abscissa shows the normalized frequency (dimensionless quantity). Regarding the ordinates, the left axis shows the real part of the impedance (unit: ohm), and the right axis shows the phase of the impedance (deg). Further, in FIG. 5, a line showing the characteristic of the real part of the impedance with respect to the frequency is indicated by a broken line, and a line showing the characteristic of the phase with respect to the frequency is indicated by a solid line.

The larger the real part of the impedance, the larger the loss. Further, the loss becomes larger as the phase of the impedance deviates more from +90° and −90°. Here, the normalized frequency is a frequency obtained by multiplying the frequency by the pitch of the electrode fingers and dividing the result by a suitable velocity (here, sonic speed of SSBW: surface skimming bulk wave)

It was confirmed that loss was generated on a high frequency side of the resonance frequency in Comparative Example 1. This becomes conspicuous particularly at the time when a sufficient gap length cannot be secured in a case of a high frequency where the frequency to be applied is for example 2.3 GHz. However, this tendency is confirmed even at the normalized frequency, therefore this phenomenon may occur without being limited to a high frequency band.

It can be confirmed that loss is relatively suppressed on a high frequency side of the resonance frequency in Comparative Example 2. However, an increase of loss on a low frequency side of the resonance frequency can be confirmed.

Contrary to this, in the case of the SAW element 1 in Example 1, it was confirmed that occurrence of loss on a high frequency side of the resonance frequency which was confirmed in Comparative Example 1 can be suppressed. Further, it was confirmed that the SAW element 1 in Example 1 was suppressed in occurrence of loss on a lower frequency side than the resonance frequency.

That is, it was confirmed, that, in the SAW element 1 in Example 1, by providing the Configuration 1 and Configuration 2, loss in the vicinity of the resonance frequency can be suppressed.

This mechanism will be considered based on the results of simulation of the distribution of leakage of the bulk wave (vibration distribution) to the thickness direction of the piezoelectric substrate 2.

As a result of simulation of the vibration distribution just under the IDT electrode, in a frequency band having a higher frequency than the resonance frequency, it was confirmed that leakage of the bulk wave could be suppressed by providing the increase sections Sh in the regions overlapping with the tip parts 34 when viewed from the direction of propagation of the SAW.

On the other hand, even in the same configuration, in a frequency band having a lower frequency than the resonance frequency, it was seen that the bulk wave leaked to an obliquely downward direction from the tip part 34 toward the lower surface 2B side of the piezoelectric substrate 2 increased due to the increase section Sh. That is, it will be understood that, in a frequency band having a lower frequency than the resonance frequency, a bulk wave that is leaked from the tip part 34 toward the direction of the dummy electrode 33 side beyond the gap Gp increases due to the increase section Sh. Therefore, when viewing it along the direction of propagation of the SAW, it was confirmed that the leakage of the bulk wave on a lower frequency side than the resonance frequency could be reduced if all parts were not formed as the increase sections Sh, but the electrode fingers 32 were alternately provided with the increase sections Sh in the regions overlapping with the tip part 34 where leakage originated. That is, it was confirmed that loss could be suppressed on the two sides of the higher frequency side and lower frequency side from the resonance frequency by providing the Configuration 1.

Here, the center part 35 in an electrode finger 32 is the portion determining the characteristics of the SAW to be excited and occupies most of the electrode finger 32. For this reason, the tip part 34 of the electrode finger 32 is short in the length of extension in the y-direction in comparison with the center part 35. For example, it is made 5% or less. Further, the thickness of the increase section Sh only has to be greater than the thickness of the section Sn. Specifically, it may be set within a range of 1.05 times to 1.5 times the thickness of the section Sn. When the thickness becomes smaller than 1.05 times, the loss becomes larger on a high frequency side of the resonance frequency. On the other hand, if the thickness is made to exceed 1.6 times, the loss tends to become larger on a lower frequency side than the resonance frequency. Note that, at the time when the thickness of the increase section Sh is made 1.45 times relative to the thickness of the section Sn (increased by 45%), it was confirmed that loss was suppressed on both of the high frequency side and low frequency side of the resonance frequency. From the above description, the thickness of the increase section Sh may be made 1.05 to 1.5 times relative to the thickness of the section Sn as well. More preferably, it may be made 1.1 to 1.5 times as well.

Such an increase section Sh may be configured by simply increasing the thickness of the conductive layer 15 or may be configured by a laminate structure.

<Verification of Effects Due to Increase Section Sh in Tip Area Ae>

Next, the configuration for suppressing loss in the vicinity of the resonance frequency as explained above will be verified. First, in order to verify the effect of the provision of the increase section Sh in the tip area Ae, simulation was carried out for four models shown in FIG. 6. That is, models of Comparative Example 1, Comparative Example 3, Example 2, and Example 3 were prepared for simulation. Comparative Example 3 is modeled on a SAW element increasing the film thickness only in portions overlapping with the gaps. Example 2 is modeled on a SAW element forming the tip parts 34 to a usual thickness, but increasing the film thickness in the portions overlapping with the gaps and tip parts 34. As Example 3, a SAW element making the film thickness greater in only the tip parts 34 is modeled on. Note that, in FIG. 6, in the same way as FIG. 3, hatching is attached to the portions having greater thicknesses.

Figure 7:
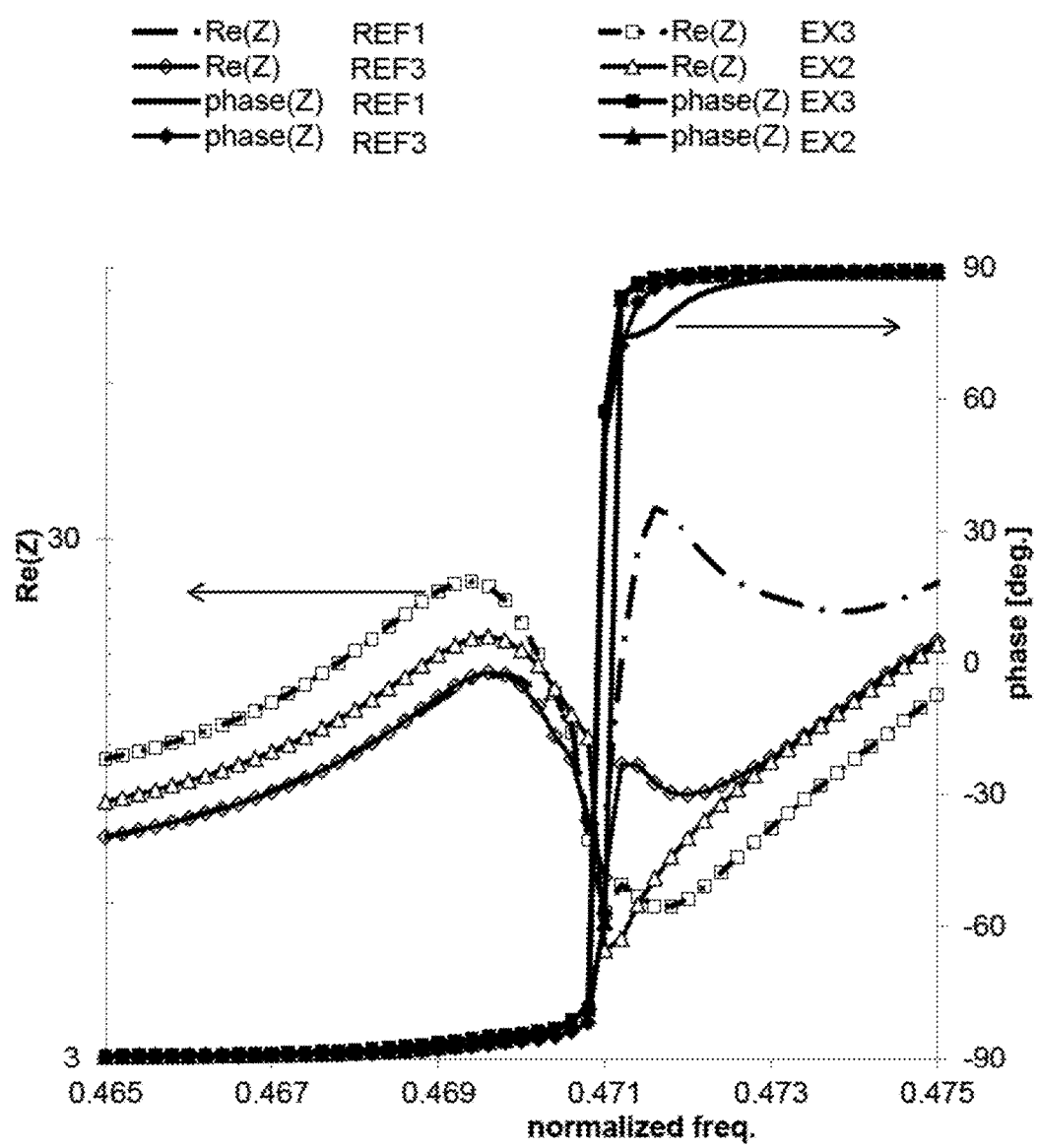
FIG. 7 A graph showing the frequency characteristics in examples and comparative examples.

The results thereof will be shown in FIG. 7. In FIG. 7, the abscissa shows the normalized frequency, while the ordinates show the real part of the impedance and the phase. As apparent also from FIG. 7, in each of Comparative Example 1 and Comparative Example 3 not providing a portion having a large film thickness (increase section Sh) in the tip area Ae, loss is generated on a high frequency side of the resonance frequency. Contrary to this, in Example 2 making the electrode thickness greater even in the portions overlapping with the tip parts 34 when viewed from the direction of propagation of the SAW and in Example 3 making the electrode thickness greater only in the tip parts 34, it could be confirmed that loss could be suppressed on a high frequency side of the resonance frequency. In particular, the difference of configuration in Example 2 from that in Comparative Example 3 resides only in the point that the film thicknesses of the portions overlapping with the tip parts 34 when viewed along the direction of propagation of the SAW are made greater. From this fact as well, it can be confirmed that the provision of the increase section Sh in the tip area Ae is important.

Further, loss can be suppressed on a high frequency side of the resonance frequency in both of Examples 2 and 3. Therefore, it was confirmed that the provision of the increase sections Sh in the tip parts 34 was not essential and that the effect was exerted by providing the increase sections Sh in the portions overlapping with the tip parts 34 in the direction of propagation of the SAW. Further, when comparing Examples 2 and 3, it can be confirmed that the effect of suppression of loss on a lower frequency side than the resonance frequency is higher in Example 2. It was confirmed from this that the increase sections Sh could be provided not only in any one electrode finger, but also in the regions laterally offset from the gaps.

<Verification of Effects Due to Configuration 2>

Next, simulation was carried out in order to verify the effects of the Configuration 2. Specifically, models were prepared for the SAW elements in Example 1, Example 3, and Example 4 for simulation. Example 4 shows a model in which thicknesses of the dummy electrodes 33 and tip parts 34 and the portions in the electrode fingers 32 which overlap the gaps Gp when viewed from the direction of propagation of the SAW are made greater. That is, Examples 1 and 4 are provided with the Configuration 2, but Example 3 is not provided with the Configuration 2. When further paraphrasing this, Example 4 employs a configuration where also a part corresponding to the part which became the increase section Sh in Comparative Example 3 was additionally formed as the increase section Sh in the configuration of Example 1.

Figure 8:
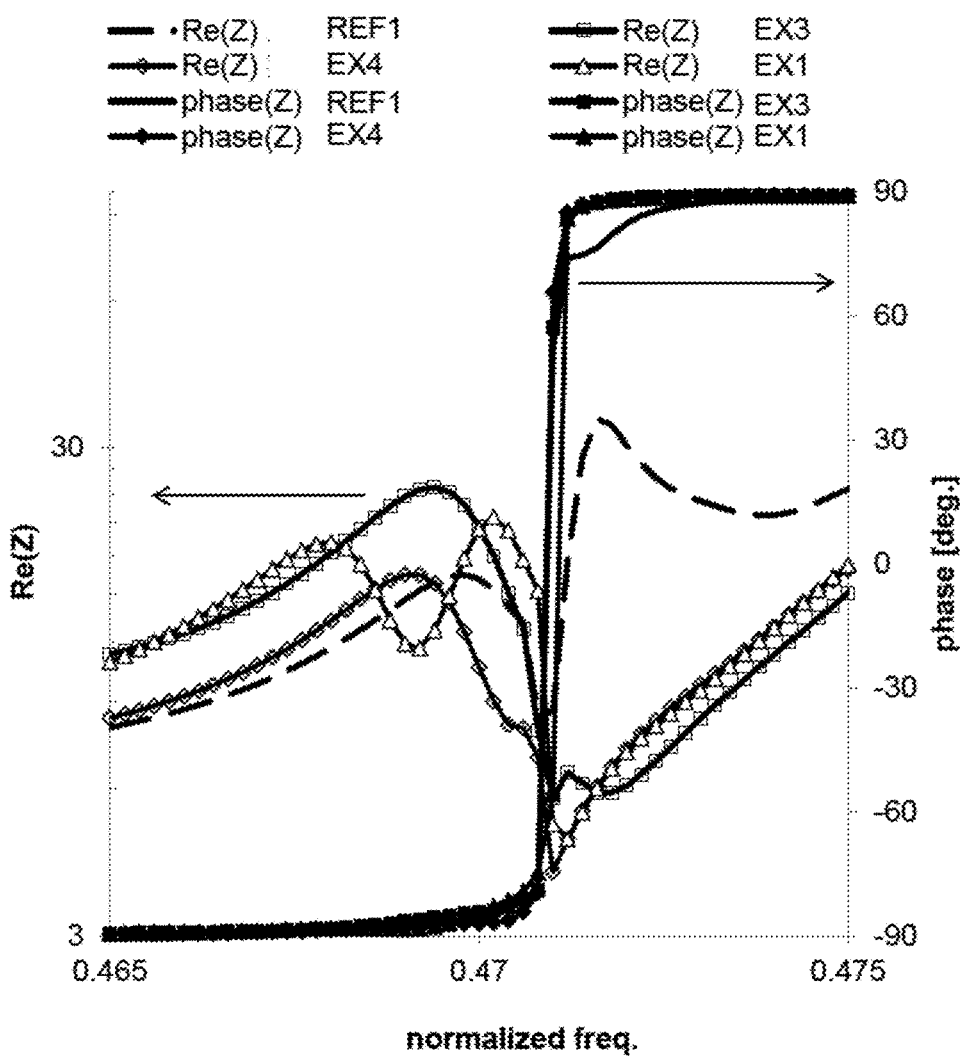
FIG. 8 A graph showing the frequency characteristics in examples and comparative examples.
Figure 10:
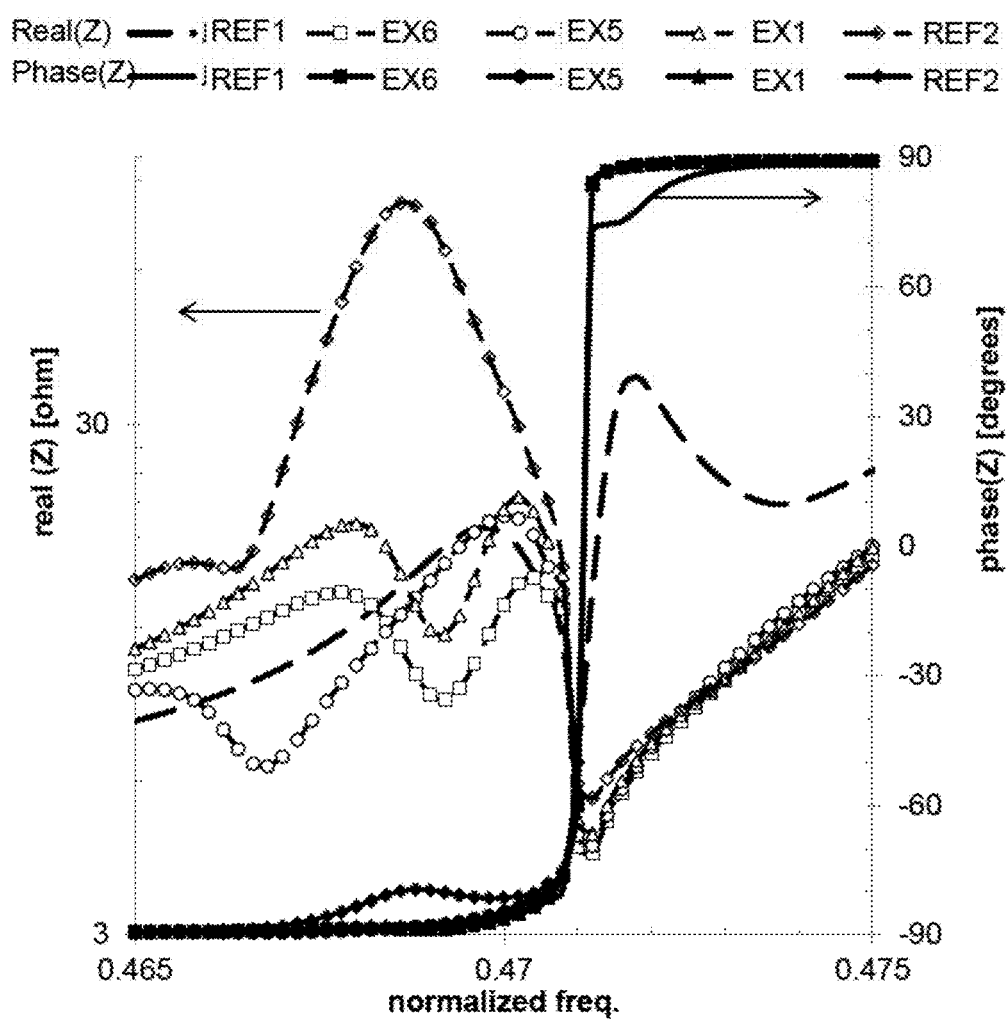
FIG. 10 A graph showing the frequency characteristics in examples and comparative examples.

The results thereof will be shown in FIG. 8. In FIG. 8, the abscissa shows the normalized frequency, while the ordinates show the real part of impedance and the phase. As apparent also from FIG. 8, in comparison with Example 3 not provided with the Configuration 2, in Examples 1 and 4 provided with the Configuration 2, by making the thicknesses of the dummy electrodes 33 greater in addition to the tip parts 34, it will be understood that loss on a high frequency side of the resonance frequency is further suppressed and that loss on a low frequency side of the resonance frequency can be reduced. Further, when comparing Example 1 and Example 4, it was confirmed that loss on a low frequency side of the resonance frequency can be further suppressed by making the thicknesses of the portions overlapping with the gaps Gp along the direction of propagation of the SAW thicker.

It was seen also from this fact that, in order to suppress the loss on a low frequency side of the resonance frequency, the increase sections Sh should be provided at least at one of the dummy electrodes 33 and the electrode fingers 32 in the end areas.

<Verification of Effects According to Configuration 1>

Next, simulation was carried out in order to verify the effects according to the Configuration 1. Specifically, models were prepared for the SAW elements in Comparative Example 1, Comparative Example 2, Example 1, and Examples 5 and 6, for simulation. The configurations of these SAW elements will be shown in FIG. 9. In FIG. 9, in the same way as FIG. 3, the portions having thick electrode thicknesses are given hatching. As shown in FIG. 9, in Example 5, thicknesses of root portions of the electrode fingers 32 (bus bar sides) are made larger in the end areas, and the thicknesses of the dummy electrodes 33 are made larger. In other words, in the end areas, only the tip parts 34 are made the same in thicknesses as the center part 35, and the portions other than these are formed as the increase sections Sh. That is, in Example 5, compared with Comparative Example 2, the thicknesses of the tip parts 34 are made the same as the thickness of the center part 35, thereby realizing the Configuration 1. Further, in Example 6, the thicknesses of the root portions on the bus bar sides in the electrode fingers are made thicker in the end areas, and the thicknesses of the dummy electrodes 33 are made the same as the thickness of the center part 35.

It was confirmed that every example could suppress loss in the vicinity of the resonance frequency. It could be confirmed from this fact that the places for forming the increase sections Sh in the tip areas Ae are not limited to the tip parts 34 and the dummy electrodes 33 which face each other across the gaps Gp.

Next, when comparing Example 5 and Comparative Example 2, it can be confirmed that loss on a lower frequency side than the resonance frequency can be suppressed by realizing the Configuration 1. Due to this, the importance of the Configuration 1 could be confirmed. Further, when comparing Example 1 and Example 6, the loss on a lower frequency side than the resonance frequency is suppressed in Example 6. It was confirmed from this that the loss on a low frequency side of the resonance frequency could be further suppressed by employing a configuration where the thicknesses were increased in the portions overlapping the gaps Gp in the direction of propagation of the SAW. Further, loss on a lower frequency side than the resonance frequency could be suppressed in both of Examples 5 and 6. Therefore, for the Configuration 2, when viewed from the direction of propagation of the SAW, it was confirmed that loss could be suppressed even if the dummy electrodes 33 and the electrode fingers 32 are not alternately provided with portions for providing the increase sections Sh in the areas overlapping with the dummy electrodes 35. That is, it was seen that the loss on a lower frequency side than the resonance frequency could be suppressed even if both of the dummy electrodes 33 and the electrode fingers 32 are provided with the increase sections Sh in these areas.

<Modification of Increase Section Sh>

Note that, in the examples explained above, the increase sections Sh were realized by making the thicknesses greater. However, they may also be realized by increasing the widths or may be realized by combining these.

Figure 11:
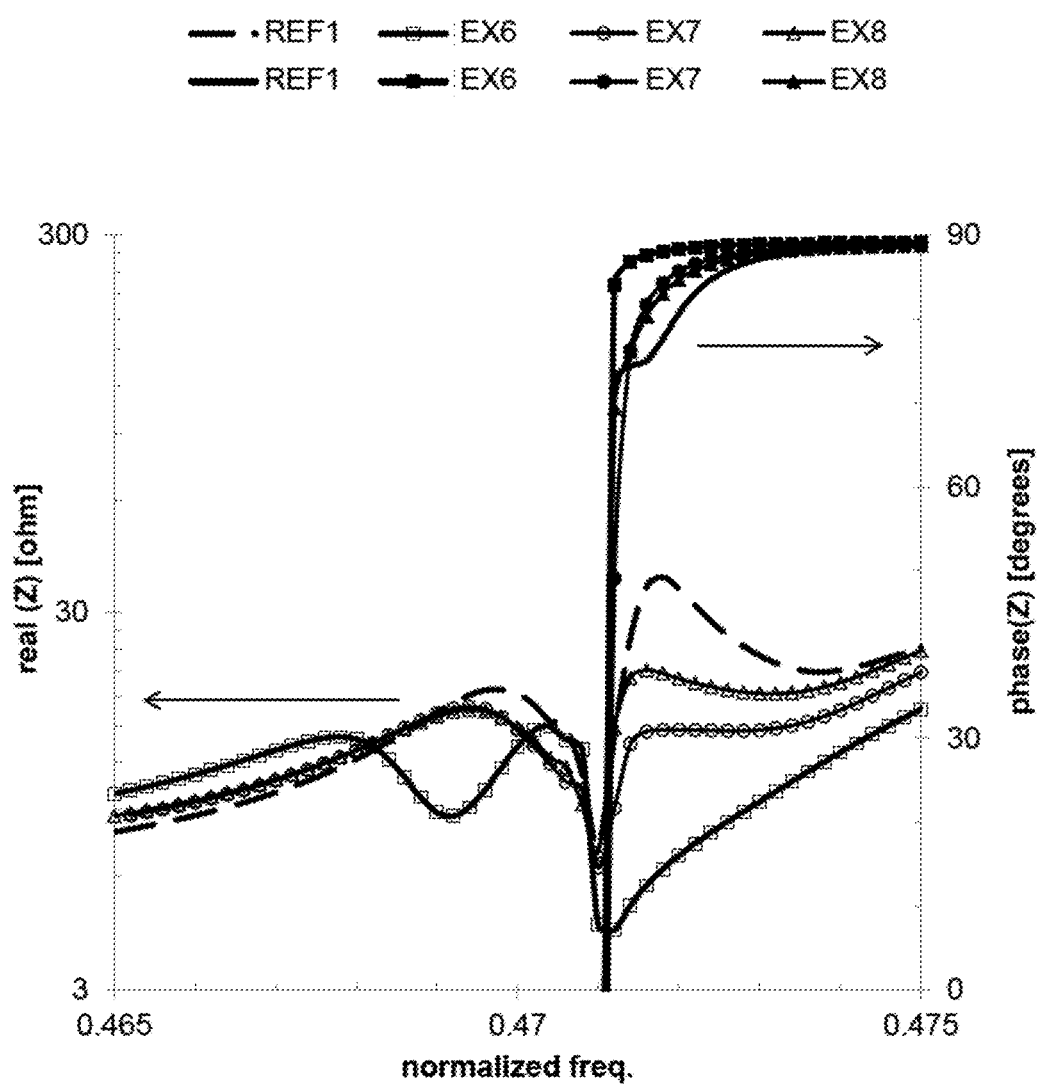
FIG. 11 A graph showing the frequency characteristics in examples and comparative examples.

As Example 7, simulation was carried out for a model making the thicknesses of the portions which were made thicker in Example 6 the same as the center part and increasing the widths of the electrode fingers by 20%. Further, as Example 8, simulation was carried out for a model in which the electrode finger widths were increased by 50%. The results thereof will be shown in FIG. 11. The effect is smaller in comparison with the case where the thickness is made larger. However, it was confirmed that loss in the vicinity of the resonance frequency could be reduced by increasing the width. Further, it was confirmed that the loss suppression effect on a higher frequency side than the resonance frequency was reduced if the width of widening was made larger.

<Other Modifications>

In the examples explained above, the explanation was made of the case where both of the end areas A1 and A2 were provided with the increase sections Sh. However, they may be provided in only one as well.

Further, in the examples explained above, the explanation was given of the case where the piezoelectric substrate was sufficiently thick. However, a support substrate may be bonded to the lower surface thereof as well.

Figure 12:
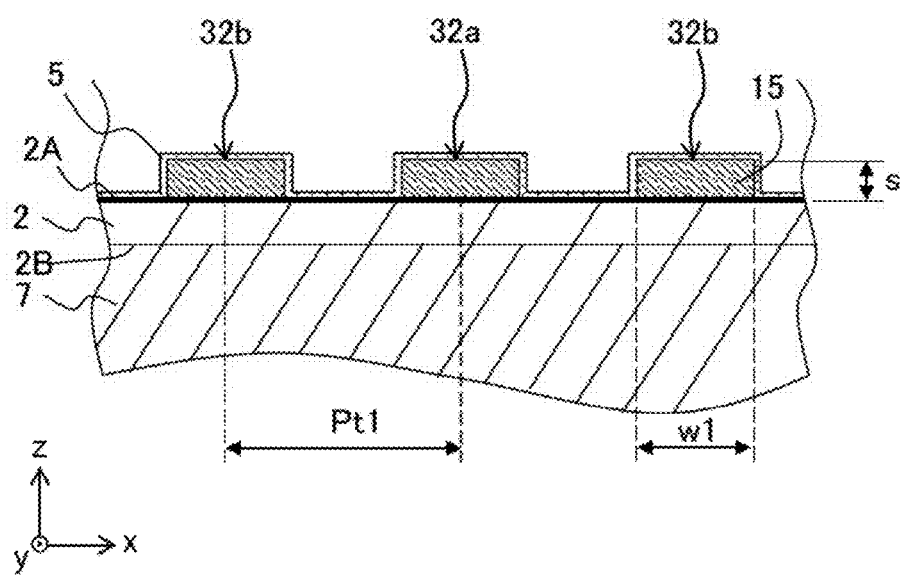
FIG. 12 An enlarged cross-sectional view of the principal part of an acoustic wave element in a modification.

FIG. 12 is a cross-sectional view of a modification of the SAW element 1. In FIG. 12, a support substrate 7 is bonded to the lower surface 2B of the piezoelectric substrate 2. That is, in the present example, an element substrate is configured by a bonded substrate of the piezoelectric substrate 2 and the support substrate 7.

In such case, the thickness of the piezoelectric substrate 2 may be set to for example 0.2 µm to 30 µm.

The support substrate 7 is for example formed by a material having a smaller thermal expansion coefficient than the material for the piezoelectric substrate 2. Due to this, a change of the electrical characteristics of the SAW element 1 due to temperature can be compensated for. As such a material, for example, there can be mentioned silicon or another semiconductor, a sapphire or another single crystal, and an aluminum oxide sintered body or another ceramic. Note that, the support substrate 7 may be configured by stacking a plurality of layers which are made of materials different from each other as well.

The thickness of the support substrate 7 is for example constant over the entire planar direction of the support substrate 7. The extent of thickness may be suitably set in accordance with the specifications etc. demanded from the SAW element 1. However, the thickness of the support substrate 7 is made greater than the thickness of the piezoelectric substrate 2 so that temperature compensation is suitably carried out or the strength of the piezoelectric substrate 2 can be reinforced. As an example, the thickness of the support substrate 7 is 100 µm to 300 µm. The planar shape and various dimensions of the support substrate 7 are for example equal to the piezoelectric substrate 2.

The piezoelectric substrate 2 and the support substrate 7 are for example bonded to each other through a not shown bonding layer. The material of the bonding layer may be an organic material or may be an inorganic material. As the organic material, for example, there can be mentioned a thermosetting resin or another resin. As an inorganic material, for example, there can be mentioned $SiO_2$. Further, the piezoelectric substrate 2 and the support substrate 7 may be bonded to each other by so-called "direct bonding" of bonding the bonding surfaces to each other without bonding layers after activation by plasma or the like. Further, a layer having a fast sonic speed and a layer having a slow one may be stacked in order as the acoustic reflection films between the piezoelectric substrate 2 and the support substrate 7.

In a SAW element using such an element substrate, due the increase sections Sh, in addition to loss, spurious emission in the vicinity of the resonance frequency can be suppressed.

Note that, in the examples explained above, simulation was carried out for the case where the gap length was made 0.2 time the electrode finger pitch. This is because, if the gap length becomes substantially 0.2 time of the electrode finger pitch, leakage of the bulk wave from the tip part 34 to the thickness direction of the substrate is no longer ignorable, therefore loss on a high frequency side of the resonance frequency becomes conspicuous. For this reason, particularly at the time when the gap length is made 0.2 time or more of the electrode finger pitch, provision of the increase section Sh is preferable.

<Communication Apparatus>

Next, a communication apparatus 100 using the SAW element 1 explained above will be explained by using FIG. 13.

Figure 13:
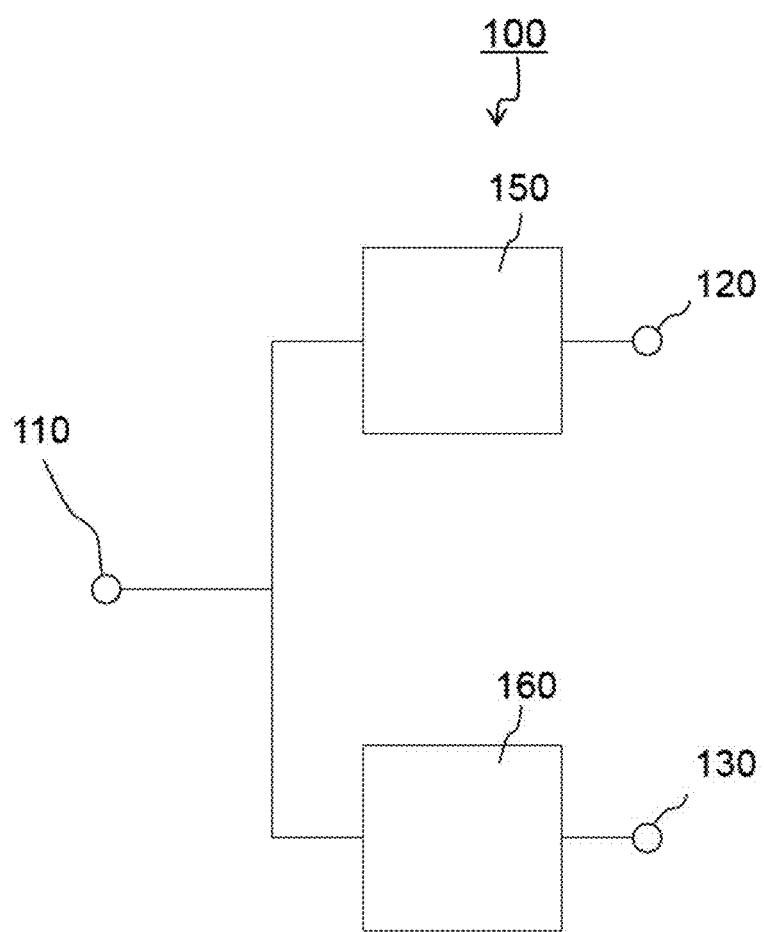
FIG. 13 A block diagram showing an example of a communication apparatus of the present disclosure.

FIG. 13 is a block diagram showing a principal part of the communication apparatus 100 in the present disclosure. The communication apparatus 100 performs wireless communications utilizing radio waves.

The communication apparatus 100 is provided with a first terminal 110, second terminal 120, and third terminal 130. These terminals are connected so that high frequency signals can be input and output by the first terminal 110 and second terminal 120 and high frequency signals can be input and output by the first terminal 110 and third terminal 130.

Further, a first filter 150 is positioned between the first terminal 110 and the second terminal 120, and a second filter 160 is positioned between the first terminal 110 and the third terminal 130. Note that, at least one of the first filter 150 and the second filter 160 is an acoustic wave filter using a SAW element. As the acoustic wave filter, a ladder type filter, multiple-mode type filter, etc. can be exemplified. Further, the first filter 150 has a first passing band, and the second filter 160 has a second passing band which is different from the first passing band.

For example, when a not shown antenna is connected to the first terminal 110, a transmission signal is input to the second terminal 120, and a reception signal is output from the third terminal 130, the first filter 150 functions as the transmission filter, the second filter 160 functions as the receiving filter, and the communication apparatus 100 becomes functions as the multiplexer.

The SAW element 1 explained above is used in the acoustic wave filter configuring such a first filter 150 and second filter 160. By employing such a configuration, a communication apparatus with little loss can be provided.

Note that, the SAW element 1 may be used in both of the first filter 150 and the second filter 160 or may be used in only the filter having a higher frequency band between the first passing band and the second passing band. Further, when there is a plurality of SAW elements in one filter, the SAW element 1 may be used for all of the SAW elements or may be applied to part of the SAW elements.

The present invention is not limited to the above embodiments and may be executed in various ways. Further, the embodiments explained above may be suitably combined.

REFERENCE SIGNS LIST

1 . . . acoustic wave device
2 . . . piezoelectric substrate
3 . . . IDT electrode
30 . . . comb-shaped electrode
31 . . . bus bar
32 . . . electrode finger
33 . . . dummy electrode
34 . . . tip part

7 . . . support substrate
First end area . . . A1
Second end area . . . A2
Center area . . . Ac
Tip area . . . Ae
Increase section . . . Sh.

The invention claimed is:

1. An acoustic wave element comprising:
    a piezoelectric substrate; and
    an IDT electrode on an upper surface of the piezoelectric substrate,
    wherein the IDT electrode comprises
        a first bus bar and second bus bar which are connected to potentials different from each other and are located spaced apart from each other,
        first electrode fingers, connected to the first bus bar and extending to the second bus bar side, and
        second electrode fingers, connected to the second bus bar and extending to the first bus bar side, located so as to be adjacent to each other along a direction of propagation of an acoustic wave,
        second dummy electrodes which are connected to the second bus bar and face the first electrode fingers across first gaps, and
        first dummy electrodes which are connected to the first bus bar and face the second electrode fingers across second gaps,
    three areas extending along the direction of propagation of the acoustic wave comprised of a center area comprising a portion in which the first electrode fingers and the second electrode fingers intersect and areas on the two sides of the center area comprised of a first end area closer to the first bus bar side than the center area and a second end area closer to the second bus bar side than the center area,
    the first electrode fingers comprises first tip parts in the second end area, and
    either of the first electrode fingers and the second electrode fingers comprises, at a tip area extending along the direction of propagation of the acoustic wave and overlapping with the first tip parts, increase sections which have a larger electrode volume per unit length in a direction of extension of the first electrode fingers and second electrode fingers in comparison with that of the center area, wherein, in the direction of propagation of the acoustic wave, the increase sections within the tip area are only located on alternating portions of the first electrode fingers and the second electrode fingers within the tip area.

2. The acoustic wave element according to claim 1, wherein either of the first electrode fingers and the second electrode fingers are thicker in the increase sections in comparison with the thicknesses in the center area.

3. The acoustic wave element according to claim 2, wherein either of the first electrode fingers and the second electrode fingers are thicker in the increase sections in comparison with the thicknesses in the center area by a rate of 10% or more and 50% or less.

4. The acoustic wave element according to claim 1, wherein either of the first electrode fingers and the second electrode fingers are wider in the increase sections in comparison with the widths in the center area.

5. The acoustic wave element according to claim 1, wherein either portions of the second electrode fingers located in an area overlapping with the second dummy electrodes when viewed from the direction of propagation of the acoustic wave or the second dummy electrodes, or both are the increase sections.

6. The acoustic wave element according to claim 1, wherein the second dummy electrodes and the first tip parts are the increase sections.

7. The acoustic wave element according to claim 1, wherein the second electrode fingers are the increase sections in the second end area.

8. The acoustic wave element according to claim 1, wherein, in a direction perpendicular to the direction of propagation of the acoustic wave, the first gaps are 0.2 time or more of intervals between centers of widths of the first electrode fingers and the second electrode fingers.

9. The acoustic wave element according to claim 1, wherein:
the second electrode fingers comprise second tip parts in the first end area, and
either of the first electrode fingers and the second electrode fingers comprise increase sections in a second tip area extending along the direction of propagation of the acoustic wave and overlapping with the second tip parts.

10. The acoustic wave element according to claim 1, wherein a support substrate made of a material having a smaller thermal expansion coefficient than that of the piezoelectric substrate is located on a lower surface of the piezoelectric substrate.

11. A communication apparatus comprising:
a first filter comprising a first passing band; and
a second filter comprising a second passing band which is different from the first passing band,
wherein the acoustic wave element according to claim 1 is used in an acoustic wave filter used in the first filter or the second filter.

12. The acoustic wave element according to claim 1, wherein only one of the first electrode fingers and the second electrode fingers comprises the increase sections.

* * * * *